(12) United States Patent
Philipp

(10) Patent No.: US 7,295,190 B2
(45) Date of Patent: Nov. 13, 2007

(54) TOUCH SENSITIVE CONTROL PANEL

(76) Inventor: Harald Philipp, 651 Holiday Dr., Bldg. 5, Suite 300, Pittsburgh, PA (US) 15220

( * ) Notice: Subject to any disclaimer, the term of this patent is extended or adjusted under 35 U.S.C. 154(b) by 700 days.

(21) Appl. No.: 10/851,269

(22) Filed: May 21, 2004

(65) Prior Publication Data
US 2006/0238513 A1    Oct. 26, 2006

(51) Int. Cl.
*G09G 5/00*    (2006.01)
(52) U.S. Cl. .................... 345/173; 178/18.01
(58) Field of Classification Search ........... 345/173, 345/174; 178/18.01, 18.06; 200/5 R, 512; 341/33; 439/67; 700/11
See application file for complete search history.

(56) References Cited
U.S. PATENT DOCUMENTS

| | | | |
|---|---|---|---|
| 6,664,489 B2 * | 12/2003 | Kleinhans et al. | 200/313 |
| 6,960,735 B2 * | 11/2005 | Hein et al. | 200/600 |
| 6,975,305 B2 * | 12/2005 | Yamashita | 345/173 |
| 7,084,933 B2 * | 8/2006 | Oh et al. | 349/12 |
| 7,113,175 B2 * | 9/2006 | Liu et al. | 345/173 |
| 7,196,694 B2 * | 3/2007 | Roberts | 345/173 |

FOREIGN PATENT DOCUMENTS

DE    201 19 700 U1    3/2002
WO    WO 00/31553 A1    6/2000

OTHER PUBLICATIONS

General Electric Corp., pp. 8,10,13, & 14 from Monogram Owner's Manual (http://products.geappliances.com/ProdContent/Dispatcher?REQUEST=ITEMID&itemid=49-60315),date unknown.

* cited by examiner

*Primary Examiner*—Richard Hjerpe
*Assistant Examiner*—Abbas Abdulselam
(74) *Attorney, Agent, or Firm*—David Kiewit

(57) ABSTRACT

A touch sensitive control panel is described. The control panel comprises a sensor surface in which a plurality of sensor areas are arranged and a circuit board offset from the sensor surface. The circuit board has an electrical contact associated with each of the sensor areas. The electrical contacts are connected to capacitance measurement circuitry. The control panel further comprises a guide block having a first side facing the sensor surface, a second side facing the circuit board and a plurality of channels extending from the first side to the second side. A plurality of resilient electrical conductors pass through the channels to connect between the sensor areas and the electrical contacts on the circuit board, such that the capacitance measurement circuitry is coupled to the sensor areas. The sensor surface may be curved with the resilient electrical conductors having lengths dependent on a separation between the electrical contact and the sensor area between which they connect so as to accommodate for the curvature of the sensor surface.

13 Claims, 3 Drawing Sheets

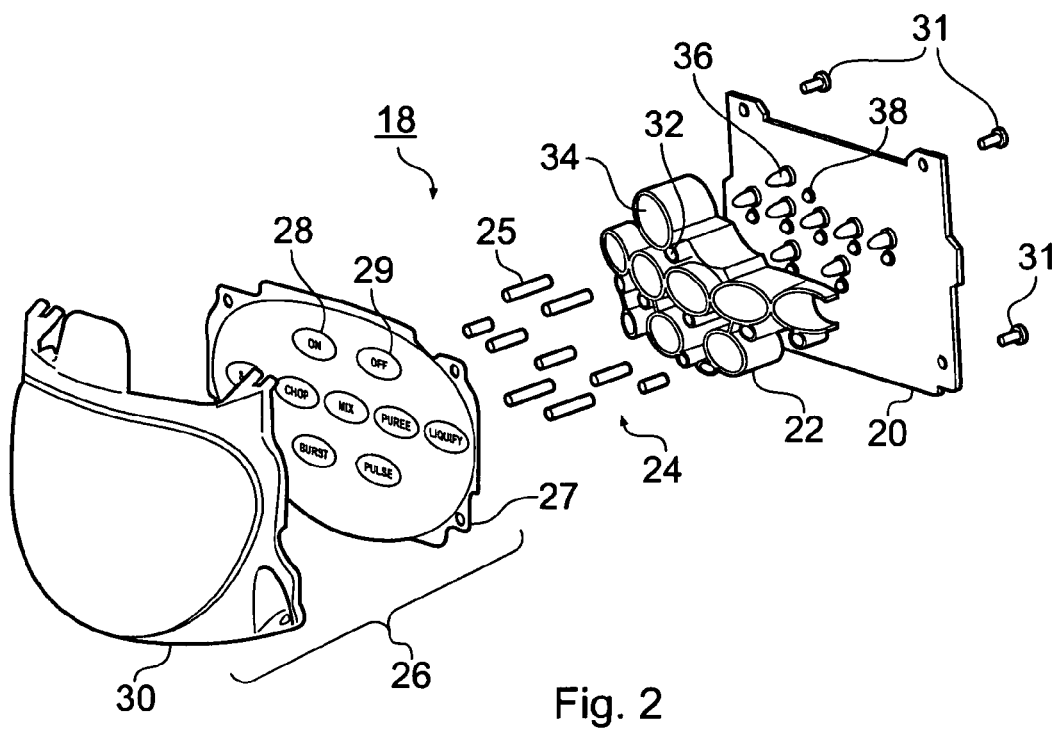
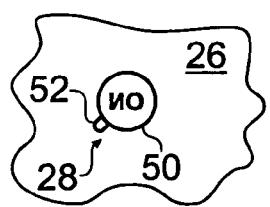
Fig. 3
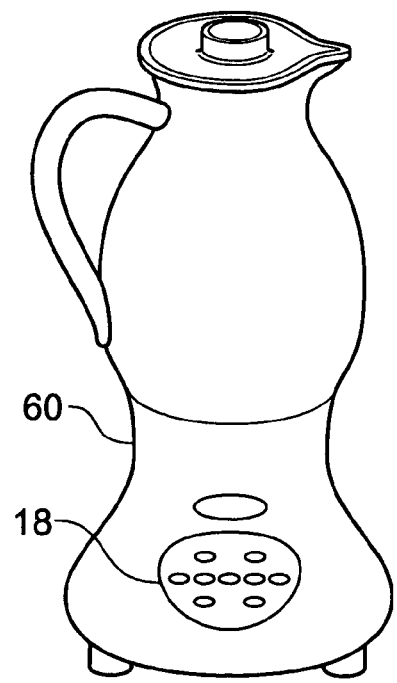
Fig. 4

TOUCH SENSITIVE CONTROL PANEL

BACKGROUND OF THE INVENTION

The present invention relates to touch sensitive control panels. In particular, the invention relates to capacitive touch sensitive control panels.

Capacitive sensors have become increasingly common and accepted for use in human interfaces and for machine control. In the field of home appliances it is now quite common to find capacitive touch controls operable through glass or plastic panels.

FIG. 1 schematically shows in vertical section a known type of touch sensitive control panel 2 as used in the Monogram™ Model ZISB480DR refrigerator made by the General Electric Company. The control panel 2 comprises a cover plate 4, a sensor-element printed circuit board (PCB) 6 and a control-circuitry PCB 12. The sensor-element PCB 6 has metallic tracks arranged to form touch sensitive areas 8a-c. The configuration of the metallic tracks define the touch sensitive areas of the control panel. The control-circuitry PCB 12 has circuitry for measuring the capacitance of the sensitive areas 8a-8c. The sensor-element PCB 4 is connected to the control-circuitry PCB 12 via wires 14. In FIG. 1, a user's finger 16 is seen approaching the touch sensitive area 8c. The capacitance of the touch sensitive area 8c is modified by the presence of the user's finger. This change in capacitance is measured by the circuitry on the control-circuitry PCB and the user's touch is accordingly identified.

Although not shown in FIG. 1, examples of this type of touch sensitive control panel may include illumination of the touch sensitive areas 8a-8c. This is achieved by providing through-holes in the sensor-element PCB 6 and associated touch sensitive areas 8a-8c through which light from a light-emitting diode mounted on the control-circuitry PCB 12 may pass. The cover plate 4 may include decals identifying particular functions of the touch sensitive areas 8a-8c.

Variations on this design, such as that shown in by E.G.O. Control Systems GmbH in DE 20119700, are also known in which conductive rubber pillars or helical springs are used to electrically connect the touch sensitive areas adjacent the cover plate and the PCB mounted control circuitry instead of wires. Moreover, in this reference, the touch sensitive areas are provided by a conductive layer printed or deposited on the cover plate, or by a metallic or metallized adhesive foil bonded to the cover plate.

Known types of touch sensitive control panels provide for user interfaces which are subject to a number of limitations. For example, they can be difficult and time consuming to assemble. This is particularly so where a number of separate touch sensitive areas are required, as is often the case. For the example touch sensitive control panel shown in FIG. 1, a separate soldering processing step is required to properly connect the sensor element PCB 6 and the control circuitry PCB 12 together. In the case of known control panels relying on conductive rubber pillars or helical springs, each of the pillars or springs must be carefully attached to a PCB containing control circuitry in proper alignment with the desired touch sensitive areas to which they relate.

In addition, known touch sensitive control panels allow for only a flat touch sensitive surface. This means they can be difficult to incorporate into some devices. This can be because of space requirements, or because a designer wishes to provide a device having a particular overall shape. For example, domestic appliances, such as food blenders, are often too small to provide a sufficiently large flat surface for a suitable control panel. This can be especially so when other aspects of a device's design, for example its ergonomics or overall appearance, need to be considered. It is not generally possible to overlay a conventional flat touch sensitive control panel with a curved cover plate because of the limited sensitivity of the capacitive sensor elements.

SUMMARY OF THE INVENTION

According to a first aspect of the invention, there is provided a touch sensitive control panel comprising: a sensor surface in which a plurality of sensor areas are arranged; a circuit board having a plurality of electrical contacts for receiving signals from respective ones of the sensor areas; a guide block having a first side facing the sensor surface, a second side facing the circuit board and a plurality of channels extending from the first side to the second side; and a plurality of resilient electrical conductors passing through respective ones of the plurality of channels in the guide block to connect between respective ones of the sensor areas and the electrical contacts.

The guide block provides positioning support for the resilient electrical conductors. Because this can be achieved without mounting or otherwise fixing the resilient electrical conductors to the circuit board, the arrangement also allows for easy and accurate positioning of the resilient electrical conductors during assembly.

The sensor surface may have a curved shape such that respective ones of the electrical contacts are spaced from their respective sensor areas by a plurality of distances and the resilient electrical conductors may have a variety of lengths matched to the respective distances in order to follow the curved shape of the sensor surface.

This provides design freedom over the shape of the control panel, since it can have an arbitrarily shaped curved surface including compound curved shapes. Furthermore, this design freedom does not compromise the desired uniform sensitivity over the different sensor areas, since the sensor areas can follow the curved surface, this being accommodated by suitable variation of the lengths of the resilient electrical conductors.

The guide block may be shaped such that its face adjacent the curved sensor surface is shaped to follow the shape of the curved sensor surface.

The guide block may include further channels in addition to those through which the electrical conductors pass. These further channels can be arranged to allow light from one or more light sources, for example light-emitting diodes mounted on the circuit board, to illuminate one or more of the sensor areas. In this way the different sensor areas can be individually illuminated. Alternatively, these channels may be arranged such that a single light source may illuminate multiple sensor areas.

The sensor areas may be formed from a transparent conductive material. This allows the full area of the sensor area to be back lit.

In addition to the electrical contacts, the circuit board may also comprise circuitry for measuring capacitances of the sensor areas. This allows for a complete control panel unit that may be integrated into a device to be controlled.

According to a second aspect of the invention, there is provided an apparatus, for example, a domestic appliance such as a food blender, having a control panel according to the first aspect of the invention.

According to a third aspect of the invention, there is provided a touch sensitive control panel comprising: a sensor surface in which regions of transparent conductive material are arranged to define a plurality of sensor areas; a circuit board having a plurality of electrical contacts for receiving signals from respective ones of the sensor areas, and a plurality of electrical conductors connecting between respective ones of the electrical contacts and the sensor areas.

This allows for a touch sensitive panel having sensor areas which may be back lit over the majority of their sensitive area. The transparent conductive material may be, for example, a conductive polymer.

According to a fourth aspect of the invention, there is provided a touch sensitive control panel comprising: a sensor surface having a curved shape in which a plurality of sensor areas are arranged; a circuit board having a plurality of electrical contacts for receiving signals from respective ones of the sensor areas, wherein the electrical contacts are spaced from their respective sensor areas by a plurality of distances; and a plurality of resilient electrical conductors connecting between respective ones of the sensor areas and the electrical contacts, the resilient electrical conductors having a variety of lengths matched to the respective distances in order to follow the curved shape of the sensor surface.

In some embodiments, a generic "off-the-shelf" control panel may be used in the apparatus. However, in general, a control panel will be designed specifically for the apparatus since this allows a shape to be chosen for the control panel which matches the design of the apparatus. The circuit board of the control panel may further includes circuitry for controlling the operation of the apparatus in response to input signals from the sensor areas.

BRIEF DESCRIPTION OF THE DRAWINGS

For a better understanding of the invention and to show how the same may be carried into effect reference is now made by way of example to the accompanying drawings in which:

FIG. 2 schematically shows an exploded perspective view of a touch sensitive control panel according to an embodiment of the invention;

FIG. 3 schematically shows a sensor area of the touch sensitive control panel of FIG. 2;

FIG. 4 shows an apparatus having a touch sensitive control panel according to an embodiment of the invention.

DETAILED DESCRIPTION

Figure 1:
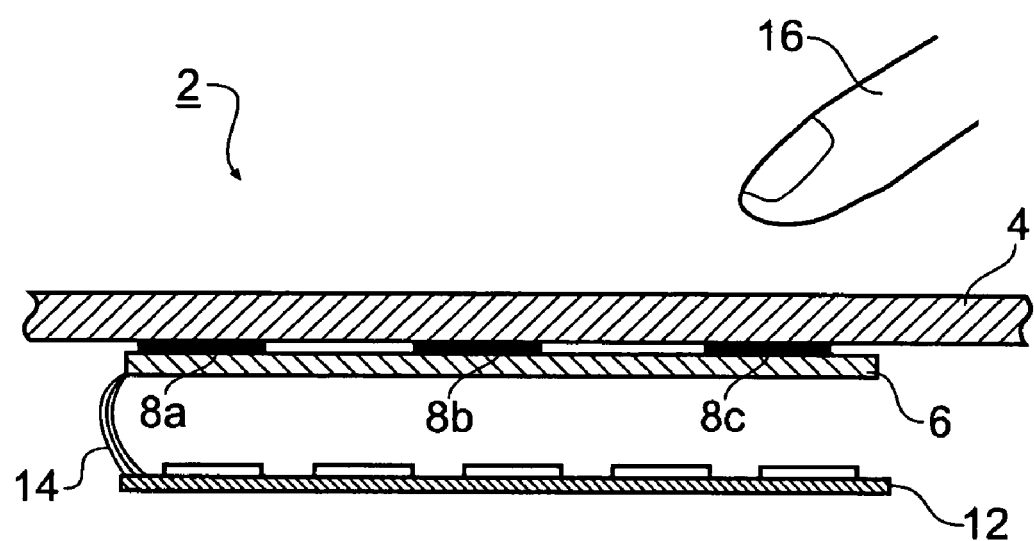
FIG. 1 schematically shows in vertical section a known touch sensitive control panel.

FIG. 2 schematically shows an exploded view of a touch sensitive control panel 18 according to an embodiment of the invention. The control panel may be used to control a device, for example a food blender, or other appliance or apparatus. The control panel comprises a PCB 20, a guide block 22, a plurality of electrical conductors 24 and a sensor substrate 26 (panel face plate).

For ease of explanation, the sensor substrate 26 is shown in FIG. 2 as two separate elements, namely a first part 30, which shows the overall configuration of the sensor substrate, and a second part 27 which is used here to represent the appearance of the rear face of the sensor substrate (the rear is defined here as the side not shown in FIG. 2).

The sensor substrate 26 comprises a transparent (or tinted) plastic moulding having, in this example, a curved shape. The sensor substrate carries a number of sensor areas corresponding to "buttons" (i.e. touch sensitive areas). These are arranged on the rear face of the sensor substrate 26 as schematically shown on the second part 27 of the sensor substrate 26 shown in FIG. 2. The sensor areas are defined by regions of transparent conductive material deposited on the rear of the substrate, in this example, Orgacon, a conductive polymer, is used (Orgacon is a trademark of AGFA Corporation, New Jersey). The locations of the sensor areas and the control functions to which they correspond are marked on the substrate to assist a user (the markings here are on the rear face of the substrate, but could equally be on the front). For example, an on-button 28 is marked "ON" and corresponds to an on function of the device. Accordingly, a user would place his/her finger in proximity to this area of the control panel to switch on the device being controlled. Other buttons corresponding to other functions of the device are also provided. In this example, a total of nine buttons are provided. In general, the number of buttons, their corresponding functions, and their arrangement on the control panel will be chosen by a designer according to the function and appearance of the device to be controlled.

FIG. 3 schematically shows in plan view a section of the rear of the sensor substrate 26. The part of the sensor substrate 26 shown in FIG. 3 is that part containing the sensor area corresponding to the on-button 28. The sensor area includes a main region 50 which provides most of the on-button's sensitive area and a smaller contact region 52 adjacent the main region 50. The contact region 52 provides a connection point for connecting the sensor area to the PCB 20 using the electrical conductors 24, as described further below. The other sensor areas corresponding to the other buttons are of similar design. Since the contact region 52 does not span the entire sensitive area of the button, a sensor area which is transparent over a significant fraction of its extent (i.e. over the main region 50) can be provided.

When the control panel is assembled, screw fixings 31 hold the PCB 20 to the sensor substrate 26. In the assembled state, the guide block 22 and electrical conductors 24 are sandwiched between the PCB 20 and the sensor substrate 26. The parts may be held in alignment using appropriately placed lugs and/or guides, for example.

The guide block 22 has a flat face which abuts the PCB 20 and a curved face which closely corresponds to the inside curvature of the sensor substrate. In examples where the sensor substrate is not curved, the guide block may have two flat faces. In cases where the sensor substrate is angled away from the PCB 20, the guide block 22 may have an overall wedge shape. It is not strictly necessary for the guide block to directly abut the PCB 20 or sensor substrate, so long as it can be maintained in an appropriate position in the assembled control panel.

The PCB 20 includes a plurality of electrical contacts, e.g. metallized pads, on a side facing the sensor substrate. These electrical contacts are aligned with respective ones of the contact regions of the sensor areas on the sensor substrate 26. The PCB 20 includes capacitance measurement circuitry for measuring a capacitance presented to each of the electrical contacts. In this example, the capacitance measurement circuitry is mounted on the rear face of the PCB 20 and cannot be seen in FIG. 2. There are nine electrical contacts, one being associated with each of the sensor areas. A corresponding nine parallel measurement channels could be provided in the capacitance measurement circuitry. However, in this example, a channel for each sensor area is provided by time-domain multiplexing of a single measurement channel using conventional techniques. In this example, the capacitance measurement circuitry employs charge transfer techniques. Example of these techniques are well documented in the inventor's WO 00/31553 EP 1 131 641 [3] and are not described here further. It will be appreciated that other types of capacitance measurement circuit may equally be employed.

The PCB 20 further includes processing logic for processing the capacitance measurements to identify when a touch occurs. The processing logic is configured to output control signals in response to touches being made. The control signals may be passed to a device controller to implement the selected functions of the device. The device controller may be mounted on a separate PCB, for example where a generic control panel is incorporated into a device, or alternatively may be on the PCB 20 to provide a device specific touch sensitive control panel.

The PCB 20 further includes a plurality of light-emitting diodes (LEDs) on the side facing the sensor substrate 26. In this example there are eight LEDs. Each of the LEDs is positioned in alignment with a respective one of eight of the sensor areas. One of the sensor areas, namely that corresponding to an off-button 29, does not have an associated LED.

The resilient electrical conductors 24 are configured to connect between respective ones of the contact regions 52 of the sensor areas and the electrical contact pads on the PCB 20. The electrical conductors thus provide appropriate electrical connections between the capacitance measurement circuitry and the sensor areas on the curved sensor surface. These connections allow the capacitance measurement circuitry to measure changes in the capacitances of the sensor areas to determine when one is touched by a user. In this example, the electrical conductors are conductive rubber pillars. However, in other examples, conductive foam, plastic or springs could also be used, for example.

The lengths of individual ones of the electrical conductors 24 are selected according to the separation between the electrical contacts on PCB 20 and the contact areas on the sensor substrate 26 between which they connect. This provides for electrical conductors 24 having different lengths to allow for the curvature of the sensor substrate in the assembled control panel. In this example, the resilient electrical conductors are each slightly longer than the separation they are to span such that they are slightly compressed when the control panel is assembled. The resilience of the electrical conductors under this compression provides for good electrical contacts. It will be appreciated that in examples where the sensor substrate is flat and parallel to the PCB 20, each of the resilient electrical conductors may have the same length.

The guide block 22 has a number of channels allowing communication between the PCB 20 and the sensor substrate 26. The electrical conductors 24 pass though a subset of these channels. For example, the electrical conductor 25 associated with on-button 28 passes through channel 32. The cross-sections of the channels through which the electrical conductor pass are such that the electrical conductors are a close fit. This means that the electrical conductors are held correctly in place during assembly and resist buckling under compression.

Most of the sensor areas have two channels associated with them. For example, the sensor area corresponding to the on-button 28 is associated with the channel 32 for the electrical conductor 25 mentioned above, and a second, wider, channel 34 connecting between the PCB 20 and the sensor substrate 26. The shape, size and location of the wider channel 34 is such that it opens onto the sensor area associated with the on-button 28. The wider channel 34 allows light from the LED 36 which is aligned with the on-button 28 to illuminate it. Walls of the channel 34 prevent neighbouring buttons from being illuminated by the LED 36. The control panel may be configured to illuminate the buttons in response to a user selecting them, or to illuminate a button, e.g. the on-button, to indicate the operating state of the device being controlled, for example. The other sensor areas have similar channels associated with them. However, since there is no LED associated with the off-button 29, there is no wider channel associated with this sensor area in this example.

The control panel 18 shown in FIG. 2 is simple and robust, easy to assemble and can provide for a touch sensitive control panel having an arbitrary curved shape, for example a shape including compound, convex, concave or saddle curves, in addition, since the form of the PCB 20 is largely decoupled from the shape of the sensor substrate 26, the PCB 20 can be applied to a wide variety of industrial designs for the shape of the outer surface of the control panel with the minimum of redesign work.

FIG. 4 schematically shows in perspective view a food blender 60 incorporating the touch sensitive control panel 18 of FIG. 2. It can be seen how the flexibility in the outer form of the control panel provided by the present invention allows for the design of an ergonomic and attractive appliance.

It will be appreciated that the design is susceptible to many modifications. For example, although providing for a control panel of unitary construction, it will be appreciated that it is not necessary for the PCB to be fixed to the sensor substrate. For example, different elements of the control panel could be independently mounted in the device being controlled.

It will also be appreciated that other types of resilient electrical conductor could be used, for example metallic springs, such as helical metallic springs could be used. Where sufficiently compressible resilient electrical conductors are used, the electrical conductors may have the same relaxed length (i.e. prior to assembly of the control panel) but be differently compressed when the control panel is assembled so as to provide them with lengths which depend on the separation between the electrical contacts and sensor areas between which they connect.

Figure 5:
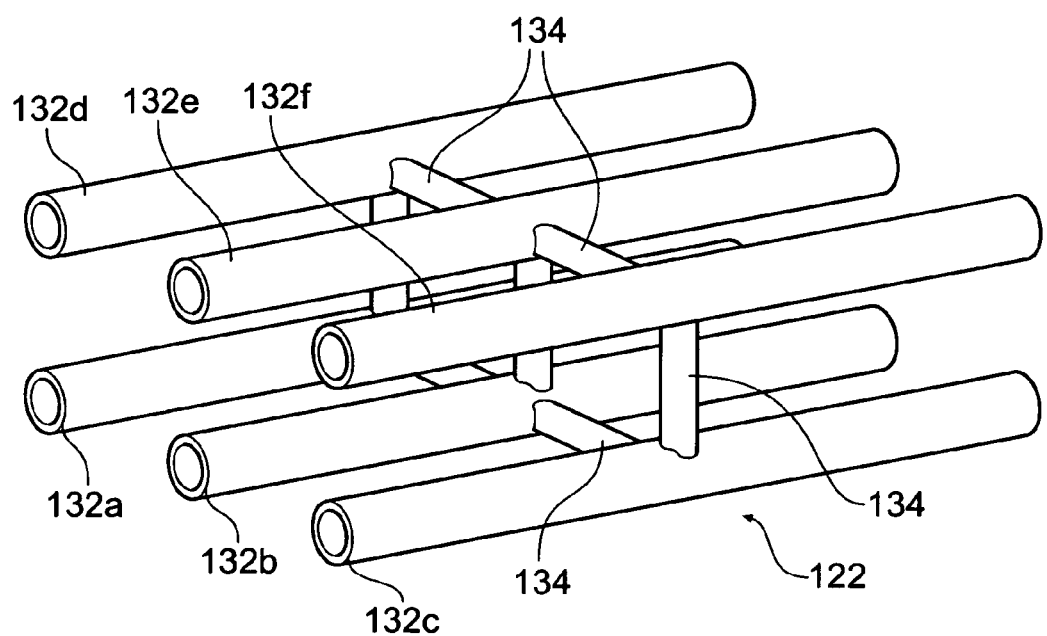
FIG. 5 schematically shows a perspective view of a guide block for use in a touch sensitive control panel according to another embodiment of the invention.

It will also be understood that other configurations of guide block may be employed. For example, where it is not required to illuminate the buttons, the additional channels for the back lighting could be dispensed with. Where it is not desired to illuminate buttons individually, a more open network of channels could be provided. This would allow a single light source to illuminate multiple buttons simultaneously, for example. FIG. 5 schematically shows an example of such a guide block 122. In this example, the guide block 122 includes six equal length channels 132a-f for a corresponding six resilient electrical conductors arranged on a regular two-by-three grid. The six channels 132a-f are supported by a network of struts 134. These struts maintain the relative positions of the six channels, but allow light from a single light source to illuminate the rear of all sensor areas on a sensor substrate.

It will be appreciated that although particular embodiments of the invention have been described, many modifications/additions and/or substitutions may be made within the spirit and scope of the present invention.

What is claimed is:

1. A touch sensitive control panel comprising:
   a sensor surface on which a plurality of sensor areas are arranged;
   a circuit board having a plurality of electrical contacts for receiving signals from respective ones of the sensor areas;
   a guide block having a first face facing the sensor surface, a second face facing the circuit board and a plurality of channels extending from the first face to the second face; and
   a plurality of resilient electrical conductors inserted into and passing through respective ones of the plurality of channels in the guide block to connect between respective ones of the sensor areas and the electrical contacts, when the guide block is sandwiched between the circuit board and the sensor surface.

2. A touch sensitive control panel according to claim 1, wherein the sensor surface has a curved shape such that respective ones of the electrical contacts are spaced from their respective sensor areas by a plurality of distances and the resilient electrical conductors have a variety of lengths matched to the respective distances in order to follow the curved shape of the sensor surface.

3. A touch sensitive control panel according to claim 2, wherein the first face of the guide block is shaped to follow the curved shape of the sensor surface.

4. A touch sensitive control panel according to claim 2, wherein the curved shape of the sensor surface comprises one of a compound curve, a convex curve, a concave curve or a saddle curve.

5. A touch sensitive control panel according to claim 1, further comprising a plurality of light sources for back lighting the sensor areas in the sensor surface, and wherein the guide block comprises a plurality of further channels extending from the first face to the second face for guiding light from the light sources to specific ones of the sensor areas.

6. A touch sensitive control panel according to claim 1, wherein the sensor areas are made of a film of conductive material arranged on the sensor surface.

7. A touch sensitive control panel according to claim 6, wherein the conductive material is transparent.

8. A touch sensitive control panel according to claim 1, wherein the resilient electrical conductors are conductive rubber pillars.

9. A touch sensitive control panel according to claim 1, wherein the resilient electrical conductors are elongate helical metal springs.

10. A touch sensitive control panel according to claim 1, wherein the circuit board comprises circuitry for measuring capacitances of the sensor areas.

11. An apparatus having a touch sensitive control panel comprising:
    a sensor surface on which a plurality of sensor areas are arranged;
    a circuit board having a plurality of electrical contacts for receiving signals from respective ones of the sensor areas;
    a guide block having a first face facing the sensor surface, a second face facing the circuit board and a plurality of channels extending from the first face to the second face; and
    a plurality of resilient electrical conductors inserted within and passing through respective ones of the plurality of channels in the guide block to connect between respective ones of the sensor areas and the electrical contacts, when the guide block is sandwiched between the circuit board and the sensor surface.

12. An apparatus according to claim 11, wherein the circuit board further includes circuitry for controlling the apparatus in response to signals from the sensor areas.

13. A touch sensitive control panel comprising:
    a sensor surface having a curved shape on which a plurality of sensor areas are arranged;
    a guide block having a first face facing the sensor surface, a second face facing the circuit board and a plurality of channels extending from the first face to the second face;
    a circuit board having a plurality of electrical contacts for receiving signals from respective ones of the sensor areas, wherein the electrical contacts are spaced from their respective sensor areas by a plurality of distances; and
    a plurality of resilient electrical conductors inserted into and passing through respective ones of the channels to connect between respective ones of the sensor areas and the electrical contacts, when the guide block is sandwiched between the sensor surface and circuit board, the resilient electrical conductors having a variety of lengths matched to the respective distances in order to follow the curved shape of the sensor surface.

* * * * *